United States Patent [19]

Komatsu

[11] Patent Number: 4,710,241
[45] Date of Patent: Dec. 1, 1987

[54] METHOD OF MAKING A BIPOLAR SEMICONDUCTOR DEVICE

[75] Inventor: Shigeru Komatsu, Kitakyushu, Japan

[73] Assignee: Kabushiki Kaisha Toshiba, Kawasaki, Japan

[21] Appl. No.: 817,103

[22] Filed: Jan. 8, 1986

[30] Foreign Application Priority Data

Jan. 17, 1985 [JP] Japan .................................. 60-6218

[51] Int. Cl.$^4$ ...................... H01L 21/36; H01L 21/38; H01L 21/42; H01L 21/00
[52] U.S. Cl. ...................................... 437/162; 357/34; 437/193; 437/31; 437/247
[58] Field of Search ...................... 357/34, 50; 148/1.5, 148/175, 176, 174; 29/576 E, 576 W, 576 T; 156/610, 612, 644

[56] References Cited

U.S. PATENT DOCUMENTS

| | | | |
|---|---|---|---|
| 4,157,269 | 6/1979 | Ning et al. | 148/1.5 |
| 4,381,953 | 5/1983 | Ho et al. | 357/34 |
| 4,396,933 | 8/1983 | Magdo et al. | 357/50 |
| 4,462,847 | 7/1984 | Thompson et al. | 148/174 |
| 4,578,142 | 3/1986 | Corboy, Jr. et al. | 156/612 |
| 4,579,621 | 4/1986 | Hine | 156/612 |
| 4,584,025 | 4/1986 | Takaoka et al. | 148/1.5 |
| 4,592,792 | 6/1986 | Corboy, Jr. et al. | 148/175 |

FOREIGN PATENT DOCUMENTS 58-56320  4/1983  Japan .
59-45997  3/1984  Japan .

OTHER PUBLICATIONS

*Jap. J. of Applied Physics*, vol. 21, No. 9, Sep. 1982, pp. 564-566, by Kohetsu Tanno et al., "Selective Silicon Epitaxy Using Reduced Pressure Technique".
*J. Electrochem. Soc. Solid State Science and Technology*, vol. 120, No. 5, pp. 664-668, by P. Rai-Choudhury et al., "Selective Silicon Epitaxy and Orientation Dependence of Growth".

*Primary Examiner*—Brian E. Hearn
*Assistant Examiner*—Chi Tso Huang
*Attorney, Agent, or Firm*—Finnegan, Henderson, Farabow, Garrett & Dunner

[57] ABSTRACT

An n-type buried layer is selectively formed in a surface region of a p-type semiconductor substrate. At least one insulating film is formed on the semiconductor substrate. A first opening is formed on the buried layer in the insulating film. An n-type polycrystalline silicon layer is formed in the first opening connected to the buried layer. A second opening is formed on the buried layer of the insulating film. An n-type monocrystalline silicon layer is formed in the second opening connected to the buried layer. A p-type base region is formed in the monocrystalline silicon layer and a collector region is formed in the remaining portion of the monocrystalline silicon layer. An emitter region is selectively formed in the base region.

7 Claims, 15 Drawing Figures

METHOD OF MAKING A BIPOLAR SEMICONDUCTOR DEVICE

BACKGROUND OF THE INVENTION

The present invention relates to an improvement in a bipolar semiconductor device, and a method of manufacturing the same.

A selective epitaxial technique, which provides a high-speed bipolar semiconductor device, has recently been attracting attention. The selective epitaxial technique is described in, e.g., N. Ohuchi et al., "A New Self-Aligned Transistor Structure for High-Speed and Low-Power Bipolar LSIs", IEDM Tech. Dig., pp. 55–58, 1983.

Figure 1:
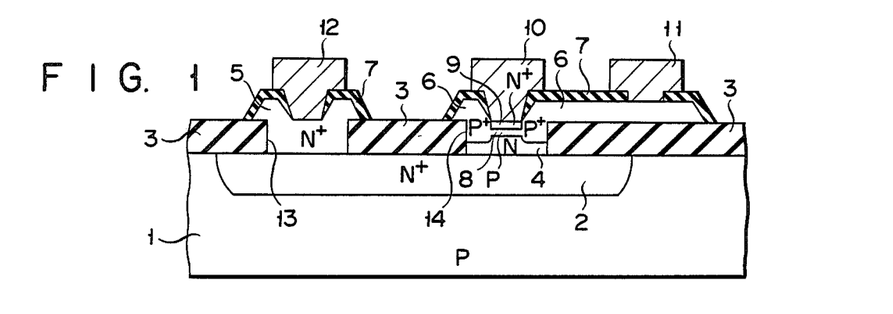
FIG. 1 is a sectional view of a conventional semiconductor device.

A method of manufacturing a bipolar transistor using the selective epitaxial technique will be described with reference to FIG. 1. N+-type buried layer 2 is formed in the surface of p-type silicon substrate 1. CVD oxide film 3 is formed on the entire surface of the resultant structure. Film 3 is selectively etched to form openings 13 and 14. N-type monocrystalline silicon layers are formed in openings 13 and 14 by selective epitaxy. The upper surfaces of the n-type monocrystalline silicon layers are recessed to correspond to the forms of openings 13 and 14. During formation of the n-type monocrystalline silicon layers, a polycrystalline silicon layer is formed on film 3. An n-type impurity is selectively ion-implanted in the monocrystalline silicon layer formed in opening 13 to form n+-type collector connection region 5. A thermal oxide film is formed on the surfaces of the monocrystalline silicon layers and the polycrystalline silicon layer on film 3. A silicon nitride film is then formed on the thermal oxide film. Photoresist is applied to the entire surface of the resultant structure, which is then etched by reactive ion etching. Thus, the thermal oxide film, the silicon nitride film and the photoresist are left only on the recessed portion of layer 4. Etching back of this type is described in S. Shibata et al., "A Simplified BOX (Buried-Oxide) Isolation Technology for Megabit Dynamic Memories", IEDM Tech. Dig., pp. 27–30, 1983.

Boron is ion-implanted in the n-type epitaxial layer in opening 14 and in the polycrystalline silicon layer on film 3 in the vicinity of the n-type epitaxial layer to form p-type graft base 6. The polycrystalline silicon layer on film 3 is etched so that a prospective base-emitter region (near the second opening) and a prospective collector connection region (near the first opening) are electrically isolated.

Annealing is performed to activate impurities in regions 5 and 6. Selective oxidation is then performed by using as a mask the remaining silicon nitride film, thus forming thermal oxide film 7. The silicon nitride film and the underlying thermal oxide film are removed. Emitter, base, and collector electrodes 10, 11, and 12 are thus formed.

When the above selective epitaxial technique is used to manufacture a bipolar transistor, the base region of the transistor can be made small, thereby decreasing base resistance. As a result, transistors manufactured with the above method are capable of high-speed and high-frequency operation.

In transistors capable of high-speed operation, an impurity must be doped at a high concentration in region 5. This is to decrease the resistance of region 5, thereby reducing the overall collector-series resistance of the transistor.

In the above method, it is preferable that annealing for forming region 5 be performed at as low a temperature as possible to maintain a high emitter-collector breakdown voltage. To form region 5 having a high impurity concentration and reaching layer 2, annealing must be performed at a temperature of about 1,000° to 1,100° C. for several to tens of minutes. When such high-temperature annealing is performed, however, the impurity is diffused from layer 2 and redistributed, thereby decreasing the emitter-collector breakdown voltage of the transistor.

Region 5 as mentioned above is formed with the following steps: (1) a monocrystalline silicon layer is formed by selective epitaxy; (2) an n-type impurity is selectively ion-implanted in the monocrystalline silicon layer; (3) part of the polycrystalline silicon layer on film 3 is removed; (4) the monocrystalline and polycrystalline silicon layers are patterned (to be isolated); and (5) the resultant structure is annealed. These steps are necessary because an impurity is diffused at a considerably high rate in the polycrystalline silicon layer formed on film 3. Therefore, when annealing is performed, n-type impurity may be diffused in the base region. The polycrystalline silicon layer is removed to prevent this. However, the above-mentioned steps (1) to (5) are complex in procedures, and productivity suffers.

SUMMARY OF THE INVENTION

It is an object of the present invention to provide a semiconductor device having a high emitter-collector breakdown voltage and capable of high-speed operation, and a method of manufacturing the same.

In order to achieve the above object, a semiconductor device according to the present invention comprises a semiconductor substrate (21) of a first conductivity type, a buried layer (22) of a second conductivity type selectively formed in a surface region of the semiconductor substrate (21), at least one insulating film (23, 25) formed on the semiconductor substrate (21) and having at least two openings (27, 30) on the buried layer (22), a conductive layer formed in at least one opening (27) of the at least two openings (27, 30) of the insulating film (23, 25, 26), directly connected to the buried layer (22) and consisting of one of polycrystalline silicon in which an impurity of the second conductivity type is diffused, a high-melting metal, and a silicide of a high-melting metal, a monocrystalline silicon layer (31) of the second conductivity type formed in at least one the other opening (30) of the at least two openings (27, 30) of the insulating film (23, 25, 26) and connected to the buried layer (22), a region (36, 37) of the first conductivity type selectively formed in the monocrystalline silicon layer (31), and a region (38) of the second conductivity type selectively formed in the region (36, 37) of the first conductivity type.

A method of manufacturing a semiconductor device according to the present invention comprises the steps of selectively forming a buried layer (22) of a second conductivity type in a surface region of a semiconductor substrate (21), forming at least one insulating film (23, 25, 26) on the semiconductor substrate (21), forming at least one first opening (27) in the insulating film (23, 25) on the buried layer (22), forming a conductive layer (29) in the first opening (27) which is connected to the buried layer (22), forming at least one second opening (30) in the insulating film (23, 25) on the buried layer (22), forming a monocrystalline silicon layer (31) of the second conductivity type in the second opening (30) which is connected to the buried layer (22), forming a region (36, 37) of a first conductivity type in the monocrystalline silicon layer (31), selectively forming a region (38) of the second conductivity type in the region (36, 37) of the first conductivity type, forming a region (36, 37) of the first conductivity type in the monocrystalline silicon layer (31), and selectively forming the region (38) of the second conductivity type in the region (36, 37) of the first conductivity type.

According to the semiconductor device and method of manufacturing the same according to the present invention, the conductive layer (29) is formed before forming the monocrystalline silicon layer (31). It is thus unnecessary to thermally treat the conductive layer (29) at high temperature after forming the monocrystalline silicon layer (31), and consequently only a small quantity of the impurity is rediffused from the buried layer (22) into the monocrystalline silicon layer (31). Therefore, the emitter-collector breakdown voltage of the obtained semiconductor device is not decreased, and the emitter-collector series resistance of the semiconductor device can be decreased, enabling high-speed operation.

DETAILED DESCRIPTION OF THE PREFERRED EMBODIMENTS

A method of manufacturing a semiconductor device according to an embodiment of the present invention will now be described with reference to FIGS. 2 to 13. In FIGS. 2 to 12, polycrystalline silicon portions are dotted to distinguish them from monocrystalline silicon portions.

Figure 2:
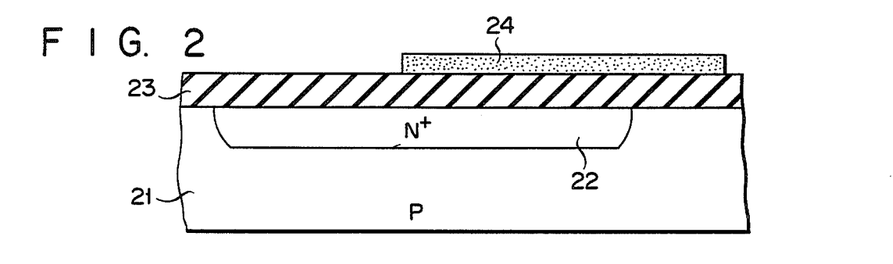
FIGS. 2 to 11 are sectional views of a semiconductor device showing respective steps of the method of manufacturing a semiconductor device according to an embodiment of the present invention.
Figure 3:
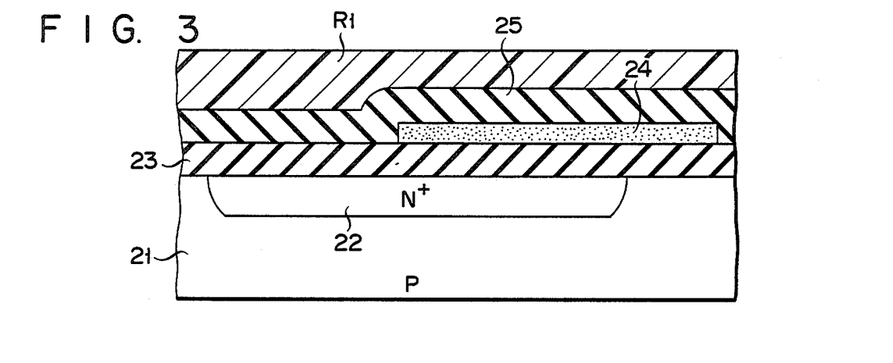

(1) An n-type impurity such as an antimony (Sb) is selectively diffused into part of p-type silicon substrate 21 with an impurity concentration of $10^{14}$ to $10^{15}/cm^2$ and a resistivity of 20 to 50 $\Omega\cdot cm$ to form $n^+$-type buried layer 22. Silicon oxide film 23, having a thickness of 0.5 to 1 $\mu m$, is formed on the entire surface of the resultant structure by, e.g., a CVD method. A boron (B)-doped polycrystalline silicon film is formed on the entire surface of the resultant structure and is patterned. Polycrystalline silicon film pattern 24, part of which lies above layer 22, is thus formed. The resultant structure is shown in FIG. 2. Note that pattern 24 serves as a diffusion source of a p-type impurity in a later step for forming a graft base (regions 36, to be described later). Pattern 24 also serves as an electrode for the graft base.

(2) Oxide film 25, having a thickness of 1 to 2 $\mu m$, is deposited on the entire surface of the structure shown in FIG. 2 by, e.g., a CVD method. Photoresist R1 is then applied, resulting in the structure shown in FIG. 3.

(3) Photoresist R1 and film 25 are etched by reactive ion etching (RIE) under the condition that the etching speed of photoresist R1 is virtually identical with that of film 25. The entire surfaces of photoresist R1 and film 25 are thus etched back, so that the surfaces of pattern 24 and film 25 are flush. This results in the structure shown in FIG. 4. Note that pattern 24 is buried in film 25, as shown in FIG. 4.

Figure 4:
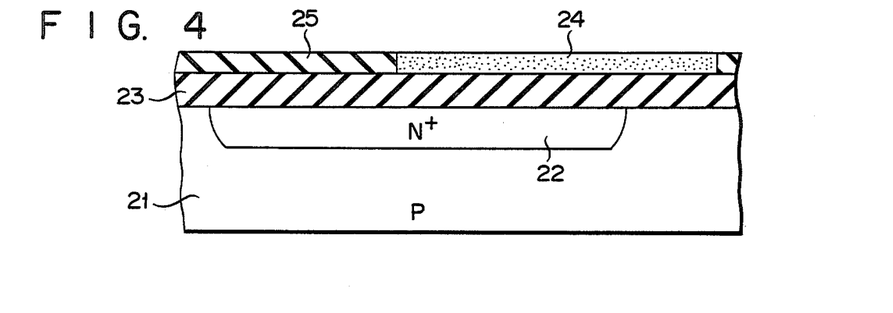
Figure 5:
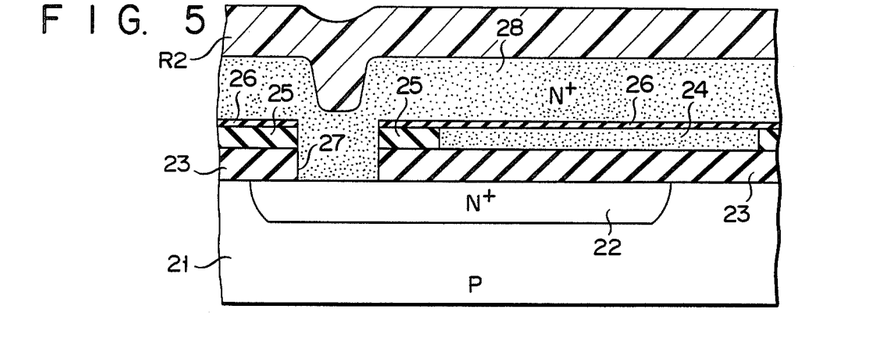

(4) Oxide film 26, having a thickness of 100 nm to 200 nm, is formed on the entire surface of the structure shown in FIG. 4 by a CVD method. Film 26 covers pattern 24. RIE is used to etch portions of films 23, 25, and 26 in order to reach layer 22. Opening (hole) 27 extending through films 23, 25, and 26 is thus formed, and serves as an opening for connection with a collector. Polycrystalline silicon film 28 is formed on the entire surface of the resultant structure by a CVD method. Film 28 has a thickness from one to two times the total thickness of films 23, 25, and 26, e.g., 1 to 2 $\mu m$. Phosphorus is doped in film 28 by, e.g., gas phase and solid phase diffusion method. The diffusion speed of the impurity doped in film 28 is a high rate. Thus, when film 28 has a thickness of about 1 to 2 $\mu m$ and phosphorus is doped at a temperature of 900° to 950° C., the doping can be terminated in about 10 to 20 minutes to decrease the layer resistance of film 28 to about several to several tens of $\Omega/\square$. Photoresist film R2 is formed over the resultant structure. This results in the structure shown in FIG. 5.

(5) The entire surfaces of photoresist R2 and film 28 are then etched back by RIE. Etching is performed so that the etching speed of the photoresist is virtually identical with that of the polycrystalline silicon. Part of film 28 thus remains in opening 27, and film 26 is exposed. The polycrystalline silicon left in opening 27 serves as $n^+$-type collector connection region 29. As mentioned above, the surfaces of region 29 and film 26 are virtually flush. The resultant structure is shown in FIG. 6.

Figure 6:
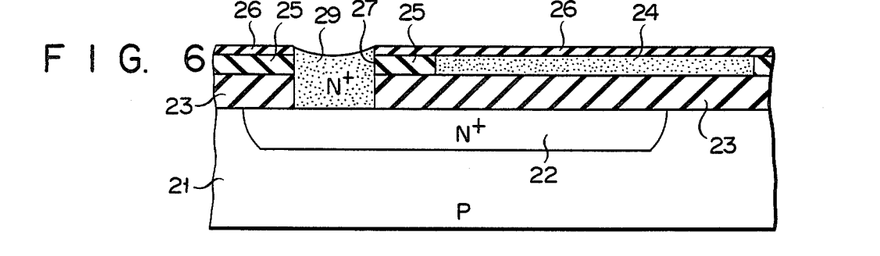
Figure 7:
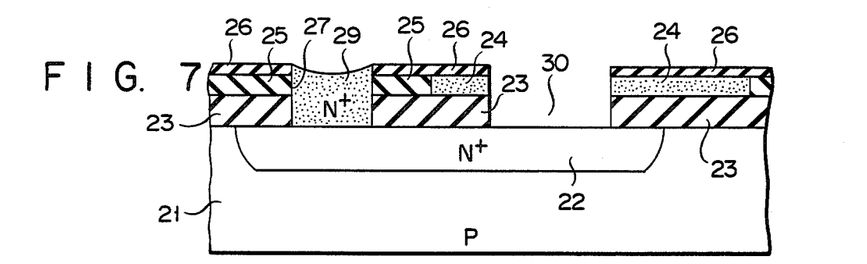
Figure 8:
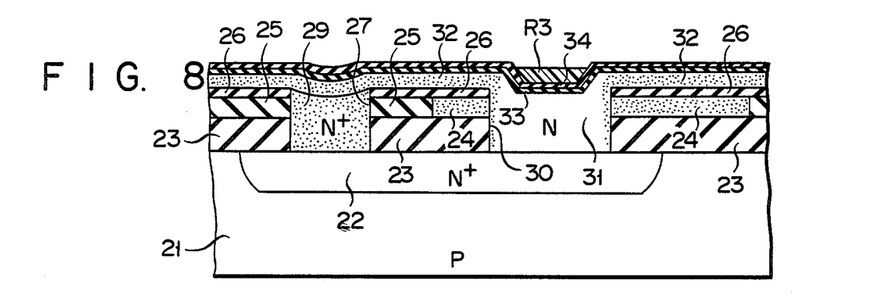
Figure 9:
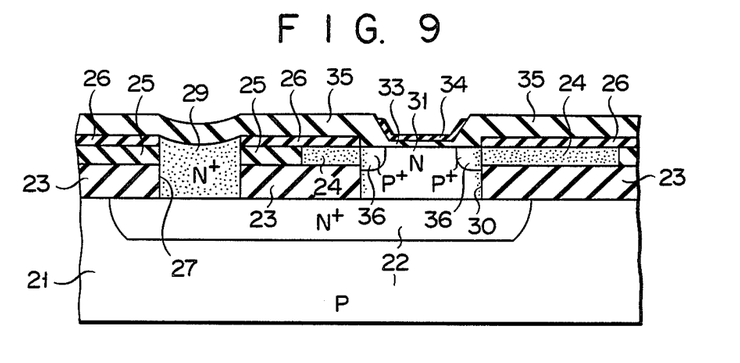

(6) A photoresist film is formed on the entire surface of the structure in FIG. 6 so that opening (hole) 30 is formed. The photoresist film is then patterned. Using the remaining photoresist pattern as a mask, parts of film 26, pattern 24, and film 23 are selectively etched by RIE. Opening 30 extends through layers 23, 24, and 26, thereby exposing part of layer 22. The purpose of opening 30 is to allow the formation of a base, an emitter and a collector to be described later. The photoresist pattern is then removed. This results in the structure shown in FIG. 7.

(7) Monocrystalline silicon layer (epitaxial layer) 31 is formed on layer 22 by selective epitaxy method. Note that polycrystalline silicon layer 32 is formed on film 26 and region 29 in the same step. Thermal oxidation is then performed to form oxide film 33, having a thickness of 50 to 100 nm, in the surfaces of layers 31 and 32. Silicon nitride film 34, having a thickness of 50 to 100 nm, is formed over the resultant structure. A photoresist pattern is applied to the entire surface of the resultant structure. The photoresist pattern is then etched to leave photoresist pattern R3 only on the portion of film 34 corresponding to layer 31. This results in the structure shown in FIG. 8.

(8) Films 34 and 33 are sequentially etched using photoresist pattern R3 as a mask. Films 33 and 34 thus remain only above layer 31. Photoresist pattern R3 is removed. Thermal oxidation is then performed using remaining film 34 as an anti-oxidation mask. As a result, most of layer 32 and part of layer 31 are converted to thermal oxide film 35. Assuming layer 32 has a thickness of 100 to 200 nm, it can be oxidized by high-speed, low-temperature oxidation at a temperature of 900° to 1,000° C., thereby forming thermal oxide film 35 with a thickness of about 200 to 400 nm. During the annealing process for forming film 35, boron doped in pattern 24 is diffused into layer 31, thereby forming p+-type graft base 36. This results in the structure shown in FIG. 9.

Figure 10:
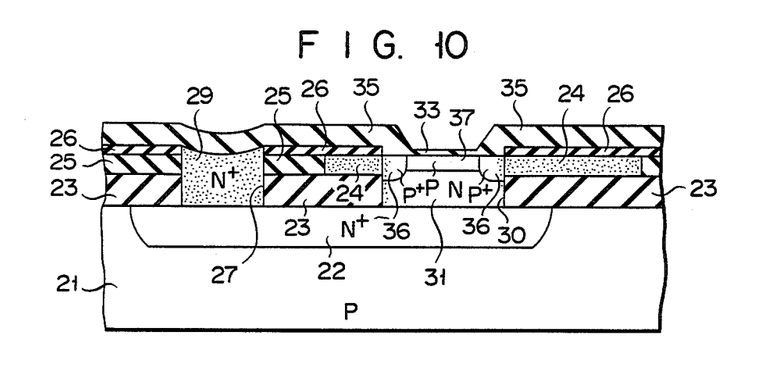
Figure 11:
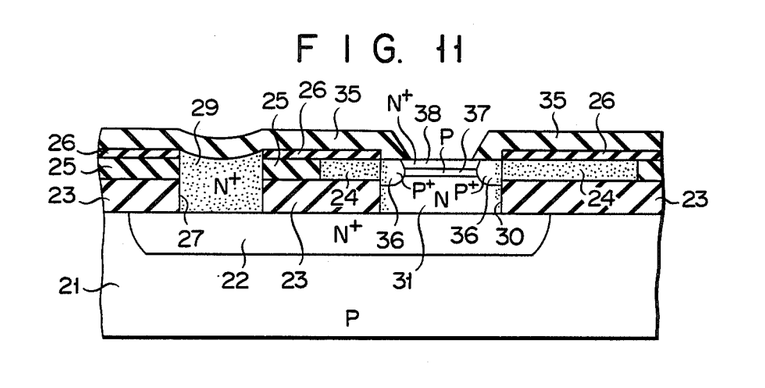

(9) Film 34 is removed. Boron is ion-implanted into monocrystalline silicon layer 31 through film 33. In this case, film 35 serves as a mask for preventing ions from being implanted in other areas. Low-temperature (below 1,000° C.) annealing is performed to activate the boron ion-implanted in layer 31. P-type active base region 37 is thus formed. The remaining portion of layer 31 becomes the collector of the transistor. The resultant structure is shown in FIG. 10.

(10) Film 33 is removed. Arsenic is ion-implanted in layer 31 using film 35 as a mask. The resultant structure is then annealed at a temperature less than 1000° C. to form n+-type emitter region 38. This results in the structure shown in FIG. 11.

Figure 12:
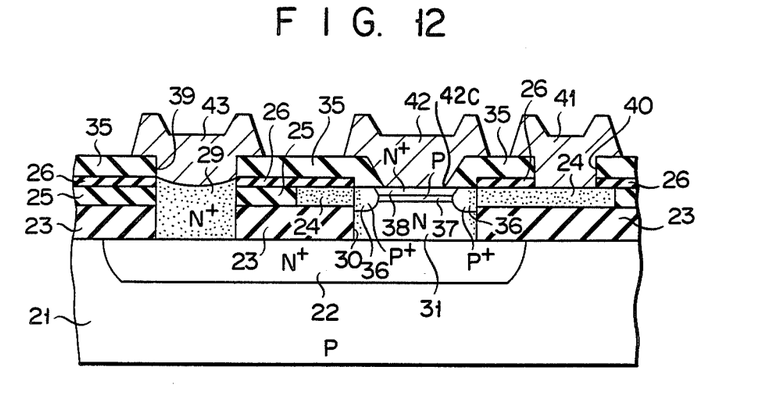
FIG. 12 is a sectional view of a semiconductor device manufactured by the method of the present invention shown in FIGS. 2 to 11.
Figure 13:
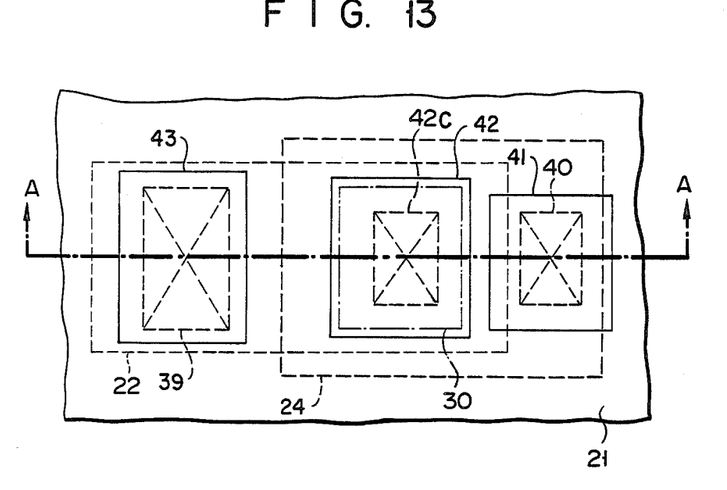
FIG. 13 is a plan view of the semiconductor device shown in FIG. 12.

(11) A portion of film 35 is selectively etched to form opening 39 on layer 29 for connection with a collector. Portions of films 26 and 35 are selectively etched to form opening 40 on pattern 24 for connection with a base. An aluminum-silicon alloy film is then deposited on the entire surface of the resultant structure. The alloy film is patterned to form emitter electrode 42, base electrode 41, and collector electrode 43. This results in an NPN bipolar transistor, of which a sectional view is shown in FIG. 12 and a plan view is shown in FIG. 13. In FIGS. 12 and 13 reference numeral 42C denotes an emitter collector. FIG. 13 is a diagram for explaining positional relationships among respective portions, so portions unnecessary for the explanation are omitted for the sake of clarity. The sectional view in FIG. 12 is taken along the line A—A of FIG. 13.

By the above-mentioned steps, a semiconductor device is obtained which has: p-type semiconductor substrate 21; n+-type buried layer 22 formed in a surface region of substrate 21; insulating films 23, 25, and 26 formed on substrate 21 and having openings 27 and 30; n+-type polycrystalline silicon layer 29 buried in opening 27 and directly connected to buried layer 22; n-type monocrystalline silicon layer 31 buried in opening 30 and directly connected to buried layer 22; p-type layers 36 and 37 selectively formed in layer 31 and serving as a base; and n-type layer 38 selectively formed in layers 36 and 37 and serving as an emitter.

The bipolar transistor manufactured in the above stpes has polycrystalline silicon collector connection region 29. Polycrystalline silicon has a high rate of impurity diffusion. Therefore, phosphorus can be doped in layer 29 in a short diffusion time at temperatures below 900° to 950° C., thereby keeping the collector resistance low. After formation of region 29, all that remains is the annealing process, which can be performed under moderate conditions required for low-temperature selective oxidation (for forming film 35) and impurity diffusion (for forming the base and emitter). Therefore only a small quantity of impurity is rediffused from the burried layer (22) into the monocrystalline silicon layer (31). As a result, even in layer 31 has a thickness as small as 1 to 2 μm, a high emitter-collector breakdown voltage can be maintained.

In order to confirm the effectiveness of the present invention, characteristics of semiconductor devices 1 and 2, obtained by conventional methods, and semiconductor device 3, obtained by a method according to the present embodiment, were compared.

EXPERIMENT 1

(1) Semiconductor Device 1

Semiconductor device 1 was manufactured under the following conditions and its impurity concentration was measured.

A p-type silicon substrate having a surface crystal orientation of (100) was prepared. A buried layer in which Sb was diffused at a concentration of about $10^{19}/cm^3$ and has a resistivity of 20 Ω·cm and a depth of 3 to 4 μm was formed in the surface of the p-type silicon substrate. N-type epitaxial layers (monocrystalline silicon layers) having an impurity concentration of about $3 \times 10^{15}/cm^3$, a resistivity of 1.5 to 2.0 Ω·cm, and a thickness of 1 μm were formed on the buried layer for connection with a collector and forming a transistor. An n-type impurity was diffused in the monocrystalline silicon layer for connection with the collector. For this purpose, $POCl_3$ was reacted with oxygen at a temperature of 1,000° C. in a gas phase and decomposed so that phosphorus was doped in the monocrystalline silicon layer. Annealing was then performed to diffuse the phosphorus.

Figure 14:
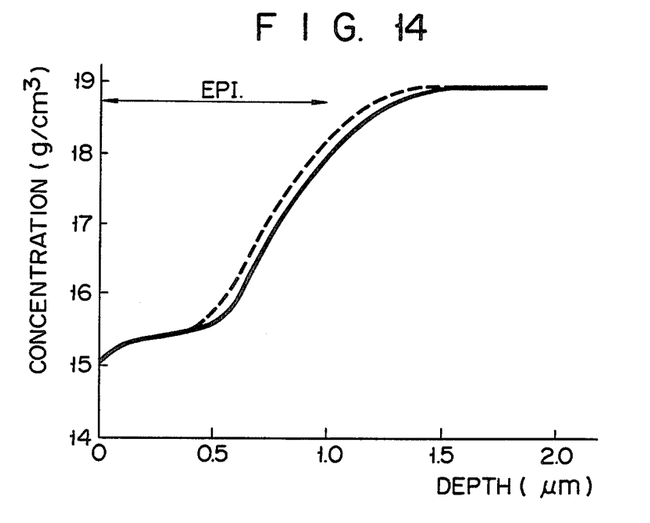
FIGS. 14 and 15 show graphs indicating the rediffusion of an impurity in the conventional method of manufacturing a semiconductor device.

Distances from the surface of the monocrystalline silicon layer for forming a transistor and impurity concentrations thereof (after epitaxy and annealing) were measured to obtain a relationship therebetween. The results are shown in FIG. 14. In FIG. 14, the solid line represents Sb concentration profile after epitaxy (immediately after formation of monocrystalline silicon layer for deriving a transistor) and the broken line represents impurity concentration after doping the n-type impurity in the collector connection layer. As shown in FIG. 14, the impurity concentration profiles observed after the two processes are different. More specifically, when the impurity is diffused into the monocrystalline silicon layer for connection with the collector, the impurity in the buried layer is rediffused into the monocrystalline silicon layer for forming a transistor. Note that the same result was obtained when an impurity was ion-implanted into the monocrystalline silicon layer for connection with the collector and then diffused at a temperature of 1,000° C.

(2) Semiconductor Device 2

A silicon substrate was prepared under the same conditions as semiconductor device 1. Monocrystalline silicon layers identical to those for device 1 were formed on the semiconductor substrate. An impurity was diffused from a PSG or P AsSG film at a temperature of 1,100° C. into the monocrystalline silicon layer for connection with a collctor, so that diffusion could be performed without distortion.

Figure 15:
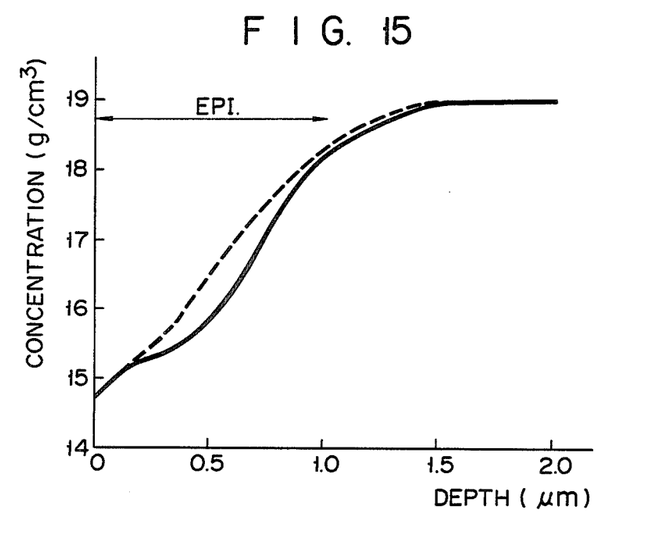

Distances from the surface of the monocrystalline silicon layer for forming a transistor and impurity concentrations thereof (after the impurity diffusion for forming collector leads) were measured to obtain a relationship therebetween. The results are shown in FIG. 15. In FIG. 15, the solid line represents impurity concentration after epitaxy and the broken line represents impurity concentration after doping the n-type impurity in the collector connection layer. As shown in FIG. 15, the impurity concentrations after the two processes are different. More specifically, when the impurity is diffused into the monocrystalline silicon layer for connection with the collector, the impurity in the buried layer is rediffused into the monocrystalline silicon layer for forming a transistor.

(3) Semiconductor Device 3

In a bipolar transistor according to this embodiment, a collector connection layer is formed before a monocrystalline silicon layer for forming a transistor. The impurity is thus not redifused from the buried layer into the monocrystalline silicon layer.

EXPERIMENT 2

Emitter-collector breakdown voltages of semiconductor devices 1 to 3 were compared to obtain the results shown in the Table below.

| Thickness of Monocrystalline Silicon Layer | 1 μm | 2 μm |
|---|---|---|
| Semiconductor Device 1 | 5 V or more | 8 V or more |
| Semiconductor Device 2 | 3 V or more | 4 V or more |
| Semiconductor Device 3 | 7 V or more | 10 V or more |

As apparent from the Table above, it is difficult to guarantee operation at 5 V of Emitter Coupled Logic (ECL) comprising a bipolar transistor obtained with conventional methods. However, with the present invention, even if the epitaxial layer (monocrystalline silicon layer) has a thickness as thin as 1 μm, operation at 5 V of ECL is guaranteed. Hence, even if the monocrystalline silicon layer has a thickness of only 1 μm, a transistor capable of operating at the so-called TTL level can be obtained.

If the impurity is even slightly diffused from layer 22 into layer 31, the collector breakdown voltage of the semiconductor device is greatly influenced. In a conventional semiconductor device, impurity rediffusion into the monocrystalline silicon layer occurs when a transistor is formed therein. In contrast to this, in the method according to the embodiment of the present invention, a collector connection layer is formed before the monocrystalline silicon layer for forming a transistor. Only moderate annealing must be performed thereafter. With the semiconductor device and the method of manufacturing the same according to the embodiment of the present invention, the collector-series resistance can be reduced without decreasing the collector breakdown voltage.

Note that in the above embodiment polycrystalline silicon is used to constitute a collector connection region. However, the present invention is not limited to this. If desired, high-melting metals such as Mo, Ti, and W resistant to high-temperature annealing under about 1,200° C. or silicides thereof can be used. Monocrystalline silicon can also be used. When these alternative materials are used, it may be difficult with RIE to guarantee the same etching speed as for the resist (in the process for etching photoresist R2 and the material, shown in FIG. 5). In this case, a selective CVD technique can be used. The selective CVD technique is described in, e.g., T. Moriya et al., "A Planar Metallization Process—Its Application to Tri-level Aluminum Interconnection", IEDM Tech. Dig., pp. 550-553, 1983. With the selective CVD technique, an alternative material can be selectively buried in opening 27.

In the above embodiment, CVD oxide film 26 is formed on polycrystalline silicon film pattern 24, and polycrystalline silicon film 28 is formed thereon. However, film 26 may be replaced by a thermal oxide film.

The conductivity types of respective portions of the semiconductor are not limited to those employed in this embodiment. P- and n-type conductivities can be exchanged to obtain the same effect.

In the embodiment, single emitter and single collector type transistor is disclosed. Not limited to this, this invention can apply to multi-emitter and multi-collector type transistor.

What is claimed is:

1. A method of manufacturing a semiconductor device, comprising the steps of:
   selectively forming a buried layer of a second conductivity type in a surface region of a semiconductor substrate of a first conductivity type;
   forming at least one insulating film on said semiconductor substrate;
   forming at least one first opening on said buried layer in said insulating film;
   forming a conductive layer in said first opening and connected to said buried layer of the second conductivity type;
   forming at least one second opening on said buried layer of said insulating film;
   forming a monocrystalline silicon layer of the second conductivity type in said second opening connected to said buried layer, said monocrystalline silicon layer being formed after forming said conductive layer;
   forming a region of the first conductivity type in said monocrystalline silicon layer; and
   selectively forming a region of the second conductivity type in the region of the first conductivity type.

2. A method according to claim 1, wherein the step of forming the conductive layer comprises the step of forming in said first opening a layer comprising a member selected from the group consisting of polycrystalline silicon in which an impurity of the second conductivity type is diffused, a high-melting metal, and a silicide of a high-melting metal.

3. A method according to claim 1, wherein the step of forming the conductive layer comprises the steps of:
   forming a polycrystalline silicon layer in said first opening; and
   doping an impurity of the second conductivity type into said polycrystalline silicon layer.

4. A method according to claim 1, further comprising the step of forming a conductive layer which is formed in the insulating film and into which an impurity of the first conductivity type is diffused, wherein
   the step of forming the second opening comprises extending said second opening through said conductive layer formed in said insulating film; and
   the step of forming the region of the first conductivity type in the monocrystalline silicon layer comprises diffusing an impurity of the first conductivity type into said monocrystalline silicon layer using as an impurity diffusion source said conductive layer formed in said insulating film.

5. A method according to claim 1, wherein the step of forming the conductive layer comprises the steps of:
   forming a conductive layer on said insulating film and in said first opening;
   forming a resist film on the conductive layer on said insulating film and in the first opening; and etching back an entire surface of the conductive layer and the resist film at substantially the same etching speed, leaving in said first opening a conductive layer virtually flush with said insulating film.

6. A method according to claim 1, wherein the step of forming the region of the first conductivity type in the monocrystalline silicon layer comprises forming a base of the first conductivity type in the monocrystalline silicon layer by annealing at a temperature less than 1,000° C., and forming the region of the second conductivity type in the region of the first conductivity type comprises selectively forming an emitter of the second conductivity type in the base by annealing at a temperature less than 1,000° C.

7. A method of manufacturing a semiconductor device, comprising the steps of:
selectively forming a buried layer of a second conductivity type in a surface region of a semiconductor substrate of a first conductivity type;
forming at least one insulating film on the semiconductor substrate;
forming at least one first opening on a portion of the buried layer in the insulating film;
forming a collector connection layer of the second conductivity type in the first opening and connected to the buried layer;
forming at least one second opening on the buried layer and in the insulating film;
forming a monocrystalline silicon layer of the second conductivity type in the second opening and connected to the buried layer, said monocrystalline layer being formed after forming said collector connection layer;
forming a base of the first conductivity type in the monocrystalline silicon layer by a heat treatment at a temperature of less than 1,000° C. and forming a collector in the remaining portion of the monocrystalline silicon layer; and
selectively forming an emitter of the second conductivity type in the base by annealing at a temperature less than 1,000° C.

* * * * *